United States Patent
Harada

(10) Patent No.: US 10,943,773 B2
(45) Date of Patent: *Mar. 9, 2021

(54) RUTHENIUM SPUTTERING TARGET AND RUTHENIUM ALLOY SPUTTERING TARGET

(71) Applicant: JX Nippon Mining & Metals Corporation, Tokyo (JP)

(72) Inventor: Kentaro Harada, Ibaraki (JP)

(73) Assignee: JX NIPPON MINING & METALS CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/399,415

(22) Filed: Apr. 30, 2019

(65) Prior Publication Data

US 2019/0259589 A1    Aug. 22, 2019

Related U.S. Application Data

(63) Continuation of application No. 14/400,939, filed as application No. PCT/JP2013/069870 on Jul. 23, 2013, now Pat. No. 10,319,571.

(30) Foreign Application Priority Data

Jul. 30, 2012 (JP) ............................. JP2012-168464

(51) Int. Cl.
  *H01J 37/34* (2006.01)
  *C23C 14/34* (2006.01)
  *H01L 21/28* (2006.01)

(52) U.S. Cl.
  CPC ...... *H01J 37/3429* (2013.01); *C23C 14/3414* (2013.01); *H01J 37/3426* (2013.01); *H01J 2237/332* (2013.01); *H01L 21/28079* (2013.01)

(58) Field of Classification Search
  None
  See application file for complete search history.

(56) References Cited

U.S. PATENT DOCUMENTS

| | | | |
|---|---|---|---|
| 6,036,741 A | 3/2000 | Shindo et al. | |
| 6,284,013 B1 | 9/2001 | Shindo et al. | |
| 7,578,965 B2 | 8/2009 | Shindo et al. | |
| 7,767,139 B2 | 8/2010 | Hisano | |
| 7,871,564 B2 | 1/2011 | Kanou et al. | |
| 10,319,571 B2* | 6/2019 | Harada | C23C 14/3414 |
| 2004/0016635 A1 | 1/2004 | Ford et al. | |
| 2004/0144204 A1 | 7/2004 | Hisano | |
| 2006/0237303 A1 | 10/2006 | Hosoya et al. | |
| 2009/0010792 A1 | 1/2009 | Yi et al. | |
| 2009/0114535 A1 | 5/2009 | Oda | |
| 2009/0144535 A1 | 5/2009 | Oda | |

FOREIGN PATENT DOCUMENTS

| | | |
|---|---|---|
| JP | 2000-178721 A | 6/2000 |
| JP | 2000-345327 A | 12/2000 |
| JP | 2002-105631 A | 4/2002 |
| JP | 2002-133653 A | 5/2002 |
| JP | 2002-327265 A | 11/2002 |
| JP | 2003-277924 A | 10/2003 |
| JP | 2004-346392 A | 12/2004 |

OTHER PUBLICATIONS

Translation to Hoshino (JP 2000-178721 as cited on IDS) published Jun. 27, 2000 (Year: 2000).*
Translation to Takatsuka (JP 2004-346392 as cited on IDS) published Dec. 9, 2004 (Year: 2004).*

* cited by examiner

*Primary Examiner* — John J Brayton
(74) *Attorney, Agent, or Firm* — Howson & Howson LLP

(57) ABSTRACT

A ruthenium sputtering target, wherein a Si content is 10 to 100 wtppm, a total content of unavoidable impurities excluding gas components is 50 wtppm or less, and a remainder is Ru. By suppressing the crystal growth of ruthenium or a ruthenium alloy and reducing the generation of coarse crystal grains, arcing that occurs during sputtering is minimized, particle generation is reduced, and yield is improved.

6 Claims, No Drawings

RUTHENIUM SPUTTERING TARGET AND RUTHENIUM ALLOY SPUTTERING TARGET

CROSS REFERENCE TO RELATED APPLICATIONS

This application is a continuation of co-pending U.S. application Ser. No. 14/400,939 which is a 371 National Stage of International Application No. PCT/JP2013/069870, filed Jul. 23, 2013, which claims the benefit under 35 USC 119 of Japanese Application No. 2012-168464, filed Jul. 30, 2012.

BACKGROUND

The present invention relates to a ruthenium sputtering target and a ruthenium alloy sputtering target, and in particular relates to a sputtering target for forming a ruthenium oxide film for use as a lower electrode of a ferroelectric capacitor of a semiconductor memory.

In recent years, ruthenium or ruthenium alloy is being used as an electronics material such as a ferroelectric capacitor for use in a semiconductor memory. Generally, the sputtering method is often used for forming a ruthenium thin film. While the sputtering method itself is a well-known method in the field of electronics, demanded is a target made from ruthenium or ruthenium alloy comprising uniform and stable characteristics that are suitable for sputtering.

Generally speaking, a commercially available ruthenium material having a relatively high purity is a 3N level powder, but materials recently used in the field of electronics are demanded of even higher purification as disclosed in the following patent documents from the perspective of preventing the generation of noise and improving characteristics, and a 5N purity level is now required as a high purity ruthenium sputtering target.

For example, Japanese Patent Application Publication No. H11-050163 A describes a high purity ruthenium target wherein alkali metal elements are each less than 1 ppm, alkali earth metal elements are each less than 1 ppm, transition metal elements are each less than 1 ppm, radioactive elements are each less than 10 ppb, carbon and gas components (oxygen, hydrogen, nitrogen, and chlorine) are less than 500 ppm in total, and purity of ruthenium excluding gas component elements is 99.995% or more.

Japanese Patent Application Publication No. 2002-105631 A describes a high purity ruthenium target wherein content of alkali metal elements is each 0.1 wtppm or less, content of alkali earth metal elements is each 0.1 wtppm or less, content of transition metal elements other than a platinum group element is each 0.1 wtppm or less, content of radioactive isotope elements is each 1 wtppb or less, total content of gas component elements is 30 wtppm or less, and purity is 99.995 wt % or more. Moreover, Japanese Patent Application Publication No. 2002-327265 A describes a high purity ruthenium target containing 10 wtppm or less of oxygen, 10 wtppm or less of nitrogen, and having a purity of 5N level or higher. In addition, Japanese Patent Application Publication No. 2000-178721 A describes a sputtering target of a composition containing 1 to 9 ppm of Si, and the remainder being Ru having a purity 99.998% or higher.

Nevertheless, when a ruthenium material is highly purified for use in a sputtering target, it is known that crystal growth is promoted and coarse crystal grains are formed (for example, Japanese Patent Application Publication No. 2002-133653 A). When these coarse crystal grains exist in the sputtering target, there is a problem in that they promote an abnormal discharge (arcing) during sputtering, and thereby increase the generation of particles and deteriorate the yield of products.

SUMMARY

An object of this invention is to provide a ruthenium sputtering target or a ruthenium alloy sputtering target which suppresses the crystal growth of ruthenium or ruthenium alloy and reduces the generation of coarse crystal grains so as to suppress as much as possible the arcing that is generated during sputtering, as well as reduce the generation of particles.

In order to achieve the foregoing object, as a result of intense study, the present inventors discovered that the coarsening of the crystal grains can be suppressed by including a trace amount of silicon (Si) in ruthenium or ruthenium alloy.

Based on the foregoing discovery, the present invention provides a ruthenium sputtering target, wherein a Si content is 10 to 100 wtppm, a total content of unavoidable impurities excluding gas components is 50 wtppm or less, and a remainder is Ru. The Si content may be 10 to 50 wtppm, the total content of unavoidable impurities excluding gas components may be 10 wtppm or less, and the remainder is Ru. An average crystal grain size of the target may be 5 to 100 μm, and a maximum crystal grain size is 500 μm or less.

The present invention provides a ruthenium alloy sputtering target, wherein the ruthenium alloy sputtering target contains 3 to 35 at % of one or more types of alloy elements selected from a group of Ta, Nb, Mo, W, and Mn, a Si content is 10 to 100 wtppm, a total content of unavoidable impurities excluding gas components is 50 wtppm or less, and a remainder is Ru. The Si content may be 10 to 50 wtppm, the total content of unavoidable impurities excluding gas components may be 10 wtppm or less, and the remainder is Ru. An average crystal grain size of the target may be 5 to 100 μm, and a maximum crystal grain size is 500 μm or less.

Since the coarsening of the crystal grains can be suppressed by including a trace amount of silicon in a ruthenium sputtering target or a ruthenium alloy sputtering target, the present invention yields extremely superior effects of being able to suppress the arcing caused by the coarse grains, enable stable sputtering, and deposit a film with few particles.

DETAILED DESCRIPTION

The ruthenium sputtering target of the present invention is characterized in that the Si content is 10 to 100 wtppm, the total content of unavoidable impurities excluding gas components is 50 wtppm or less, and the remainder is Ru. As a result of adding a trace amount of Si to high purity ruthenium having a purity of 99.995% or higher (excluding Si), it is possible to reduce the growth rate of the crystal grains of ruthenium that arise during sintering, and thereby suppress the coarsening of the crystal grains.

The silicon content is preferably 10 to 100 wtppm, and more preferably 10 to 50 wtppm. When the silicon content is less than 10 wtppm, the coarsening of the crystal grains cannot be sufficiently suppressed. Meanwhile, when the silicon content exceeds 100 wtppm, this is undesirable since the performance of the semiconductor device becomes unstable.

Moreover, the present invention additionally provides a ruthenium alloy sputtering target, wherein the ruthenium alloy sputtering target contains 3 to 35 at % of one or more types of alloy elements selected from a group of Ta, Nb, Mo, W, and Mn, a Si content is 10 to 100 wtppm, a total content of unavoidable impurities excluding gas components is 50 wtppm or less, and a remainder is Ru. As a result of adding a trace amount of Si to high purity ruthenium having a purity of 99.995% or higher (excluding silicon and alloy elements) as described above, it is possible to reduce the growth rate of the crystal grains that arise during sintering, and thereby suppress the coarsening of the crystal grains.

Since ruthenium alloy is superior in thermal stability, and also superior in low resistivity and barrier performance, ruthenium alloy is effective as a deposition material of semiconductor devices and particularly effective as a gate electrode material and various diffusion barrier materials.

With the ruthenium sputtering target or the ruthenium alloy sputtering target of the present invention, the average crystal grain size thereof is preferably 5 to 100 μm, and the maximum crystal grain size thereof is preferably 500 μm or less. When there are coarse crystal grains that exceed the foregoing numerical range, they induce an abnormal discharge (arcing) during sputtering, and thereby increase the number of generated particles.

The ruthenium sputtering target or the ruthenium alloy sputtering target of the present invention can be prepared based on the powder metallurgy method. Foremost, a refined Ru powder having a purity of 99.995% or higher and a Si powder having a purity of 99.999% or higher are prepared. Moreover, upon producing a ruthenium alloy sputtering target, a Ta, Nb, Mo, W, or Mn powder having a purity of 99.999% or higher is prepared as the alloy element.

Here, a Ru powder having an average grain size of 10 to 150 μm is preferably used. Moreover, a Si powder having an average grain size of 5 to 100 μm is preferably used, and a Ta, Nb, Mo, W, or Mn powder as the alloy element having an average grain size of 5 to 100 μm is preferably used. When the grain size of the raw material powder is too small, this is undesirable since the bulk density of the powder will increase, and there will be a limit in the weight of the powder that can be filled in a mold. Meanwhile, when the grain size is too large, this is undesirable since the sinterability will deteriorate pursuant to the decrease in the surface area, and the density of the sintered compact will consequently be low.

Subsequently, after weighing the foregoing raw material powders to be an intended composition and mixing the raw material powders, the mixed powder is filled in a carbon mold, and thereafter hot pressed under the following conditions; namely, temperature of 1200 to 1600° C., pressure of 200 to 500 kg/cm², time of 1 to 4 hours, and atmosphere of an Ar or vacuum atmosphere in order to produce a ruthenium or ruthenium alloy sintered compact.

While the present invention is not limited to the foregoing sintering conditions, when the sintering temperature and sintering pressure are too low or when the sintering time is too short, this is undesirable since it is not possible to attain a sufficient density of the sintered compact. On the other hand, when the sintering temperature and the sintering time are too long, this is undesirable since coarse grains are generated, and when the sintering pressure is too high, this is undesirable since the sintered compact will crack.

By machining the obtained sintered compact into a target shape, the sputtering target of the present invention can be produced. Note that, upon sputtering the target, the target is bonded to a backing plate prior to being sputtered.

Since the ruthenium sputtering target and the ruthenium alloy sputtering target obtained as described above can inhibit the coarsening of the crystal grains, effects are yielded in that the abnormal discharge (arcing) can be suppressed during sputtering, and the number of particles is small.

EXAMPLES

The present invention is now explained based on the following Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1

A ruthenium powder (purity 99.995%) having an average grain size of 50 μm and a silicon powder (purity 99.999%) having an average grain size of 10 μm were prepared, and the raw material powders were mixed so as to attain a Si content of 12 wtppm. Subsequently, the mixed powder was filled in a carbon mold, and hot pressed. The hot press conditions were as follows; Ar atmosphere, sintering temperature of 1500° C., sintering pressure of 200 kg/cm², and sintering time of 1 hour.

The thus obtained sintered compact was removed from the hot press furnace, and machined into a target shape to produce a sputtering target. Subsequently, the surface of the target was polished and the structure of the target surface was observed with a scanning electron microscope (SEM) to measure the crystal grain size. The measured locations were 5 locations of the target surface. Consequently, the average crystal grain size was 93 μm, and the maximum crystal grain size was 183 μm. Coarse crystal grains were not observed.

Subsequently, the target was bonded to a backing plate and thereafter mounted on a sputtering device, and then sputtered. The sputtering conditions were as follows; namely, pre-sputtering of 2 kWhr was performed with an input power of 1 kW and Ar gas pressure of 1.7 Pa, and a film was deposited on a 4-inch diameter silicon substrate for 20 seconds. Subsequently, the number of particles having a particle size of 0.25 μm or larger that adhered to the substrate was measured with a particle counter. The number of particles in this case was few at 72 particles.

TABLE 1

| Sample | | Si (wtppm) | Average Crystal Grain Size (μm) | Maximum Crystal Grain Size (μm) | Number of Particles |
|---|---|---|---|---|---|
| Example 1 | Ru | 12 | 93 | 183 | 72 |
| Example 2 | Ru | 35 | 48 | 103 | 63 |
| Example 3 | Ru | 62 | 21 | 65 | 58 |
| Example 4 | Ru | 94 | 8 | 18 | 42 |
| Example 5 | Ru - 15 at % Ta | 10 | 96 | 203 | 78 |
| Example 6 | Ru - 15 at % Ta | 40 | 53 | 123 | 60 |
| Example 7 | Ru - 8 at % Nb | 40 | 55 | 118 | 57 |
| Example 8 | Ru - 25 at % W | 90 | 15 | 28 | 37 |
| Comparative Example 1 | Ru | 3 | 121 | 520 | 131 |
| Comparative | Ru | 109 | 9 | 15 | 43 |

TABLE 1-continued

| Sample | Si (wtppm) | Average Crystal Grain Size (μm) | Maximum Crystal Grain Size (μm) | Number of Particles |
|---|---|---|---|---|
| Example 2 Comparative Example 3 | Ru - 15 at % Ta | 107 | 8 | 18 | 41 |

Example 2

Other than setting the Si content to 35 wtppm, a sputtering target was produced based on the same conditions as Example 1. As a result of observing the surface of the sputtering target, the average crystal grain size was 48 μm, and the maximum crystal grain size was 103 μm. Coarse crystal grains were not observed. Subsequently, the sputtering target was bonded to a backing plate, and sputtered based on the same conditions as Example 1. Consequently, the number of particles that adhered to the substrate was few at 63 particles.

Example 3

Other than changing the Si content to 62 wtppm, a sputtering target was produced based on the same conditions as Example 1. As a result of observing the surface of the sputtering target, the average crystal grain size was 21 μm, and the maximum crystal grain size was 65 μm. Coarse crystal grains were not observed. Subsequently, the sputtering target was bonded to a backing plate, and sputtered based on the same conditions as Example 1. Consequently, the number of particles that adhered to the substrate was few at 58 particles.

Example 4

Other than changing the Si content to 94 wtppm, a sputtering target was produced based on the same conditions as Example 1. As a result of observing the surface of the sputtering target, the average crystal grain size was 8 μm, and the maximum crystal grain size was 18 μm. Coarse crystal grains were not observed. Subsequently, the sputtering target was bonded to a backing plate, and sputtered based on the same conditions as Example 1. Consequently, the number of particles that adhered to the substrate was few at 42 particles.

Example 5

A ruthenium powder (purity 99.995%) having an average grain size of 50 μm, a tantalum powder (purity 99.995%) having an average grain size of 10 μm, and a silicon powder (purity 99.999%) having an average grain size of 10 μm were prepared, and the raw material powders were mixed so as to attain a tantalum content of 15 at %, a Si content of 10 wtppm, and remainder Ru. Subsequently, the mixed powder was filled in a carbon mold, and hot pressed. The hot press conditions were as follows; Ar atmosphere, sintering temperature of 1500° C., sintering pressure of 200 kg/cm², and sintering time of 1 hour.

The thus obtained sintered compact was removed from the hot press furnace, and machined into a target shape to produce a sputtering target.

Subsequently, the surface of the target was polished and the structure of the target surface was observed with a scanning electron microscope (SEM) to measure the crystal grain size. The measured locations were 5 locations of the target surface. Consequently, the average crystal grain size was 96 μm, and the maximum crystal grain size was 203 μm. Coarse crystal grains were not observed.

Subsequently, the target was bonded to a backing plate and thereafter mounted on a sputtering device, and then sputtered. The sputtering conditions were as follows; namely, pre-sputtering of 2 kWhr was performed with an input power of 1 kW and Ar gas pressure of 1.7 Pa, and a film was deposited on a 4-inch diameter silicon substrate for 20 seconds. Subsequently, the number of particles having a particle size of 0.25 μm or larger that adhered to the substrate was measured with a particle counter. The number of particles in this case was few at 78 particles.

Example 6

Other than changing the tantalum (Ta) content to 15 at % and the Si content to 40 wtppm, a sputtering target was produced based on the same conditions as Example 5. As a result of observing the surface of the sputtering target, the average crystal grain size was 53 μm, and the maximum crystal grain size was 123 μm. Coarse crystal grains were not observed. Subsequently, the sputtering target was bonded to a backing plate, and sputtered based on the same conditions as Example 1. Consequently, the number of particles that adhered to the substrate was few at 60 particles.

Example 7

Other than changing using a niobium (Nb) content of 8 at % and changing the Si content to 40 wtppm, a sputtering target was produced based on the same conditions as Example 5. As a result of observing the surface of the sputtering target, the average crystal grain size was 55 μm, and the maximum crystal grain size was 118 μm. Coarse crystal grains were not observed. Subsequently, the sputtering target was bonded to a backing plate, and sputtered based on the same conditions as Example 1. Consequently, the number of particles that adhered to the substrate was few at 57 particles.

Example 8

Other than using a tungsten (W) content of 25 at % and changing the Si content to 90 wtppm, a sputtering target was produced based on the same conditions as Example 5. As a result of observing the surface of the sputtering target, the average crystal grain size was 15 μm, and the maximum crystal grain size was 28 μm. Coarse crystal grains were not observed. Subsequently, the sputtering target was bonded to a backing plate, and sputtered based on the same conditions as Example 1. Consequently, the number of particles that adhered to the substrate was few at 37 particles.

Comparative Example 1

Other than changing the Si content to 3 wtppm, a sputtering target was produced based on the same conditions as Example 1. As a result of observing the surface of the sputtering target, the average crystal grain size was 121 μm, and the maximum crystal grain size was 520 μm. Coarse crystal grains had coarsened. Subsequently, the sputtering target was bonded to a backing plate, and sputtered based on the same conditions as Example 1. Consequently, the number of particles that adhered to the substrate had increased to 131 particles.

Comparative Example 2

Other than changing the Si content to 109 wtppm, a sputtering target was produced based on the same conditions as Example 1. As a result of observing the surface of the sputtering target, the average crystal grain size was 9 μm, and the maximum crystal grain size was 15 μm. Coarse crystal grains were not observed. Subsequently, the sputtering target was bonded to a backing plate, and sputtered based on the same conditions as Example 1. Consequently, the number of particles that adhered to the substrate was few at 43 particles. Meanwhile, upon measuring the volume resistivity of the formed thin film, the variation thereof had increased.

Comparative Example 3

Other than changing the tantalum (Ta) content to 15 at % and the Si content to 107 wtppm, a sputtering target was produced based on the same conditions as Example 5. As a result of observing the surface of the sputtering target, the average crystal grain size was 8 μm, and the maximum crystal grain size was 18 μm. Coarse crystal grains were not observed. Subsequently, the sputtering target was bonded to a backing plate, and sputtered based on the same conditions as Example 1. Consequently, the number of particles that adhered to the substrate was few at 41 particles. Meanwhile, upon measuring the volume resistivity of the formed thin film, the variation thereof had increased.

As described above, a ruthenium sputtering target containing a trace amount of Si can suppress the coarsening of the crystal grains, and reduce the generation of particles. Meanwhile, while the effect of preventing the coarsening of the crystal grains is yielded by increasing the Si content, such increase in the Si content is considered to affect the performance of semiconductor devices.

The ruthenium sputtering target or the ruthenium alloy sputtering target of the present invention yields extremely superior effects of being able to inhibit the coarsening of the crystal grains, suppress the arcing caused by the coarse grains, enable stable sputtering, and deposit a film with few particles. The sputtering target of the present invention is particularly effective for forming a ruthenium oxide film for use as a lower electrode of a ferroelectric capacitor of a semiconductor memory.

I claim:

1. A ruthenium sputtering target having a sintered compact structure produced from compacted and sintered powder and a composition consisting of Si in a content of 35 wtppm or more and 94 wtppm or less, Ru, and impurities excluding Ru and Si.

2. The ruthenium sputtering target according to claim 1, wherein a total content of impurities excluding gas components, Ru and Si is 50 wtppm or less.

3. The ruthenium sputtering target according to claim 1, wherein a total content of impurities excluding gas components, Ru and Si is 10 wtppm or less.

4. A ruthenium alloy sputtering target, wherein the ruthenium alloy sputtering target has a sintered compact structure produced from compacted and sintered powder and a composition consisting of Si in a content of 40 wtppm or more and 90 wtppm or less, one or more alloying elements selected from the group consisting of Ta, Nb, Mo, W, and Mn in a total content of 3 to 35 at %, Ru, and impurities excluding Ru, Si, and said one or more alloying elements.

5. The ruthenium alloy sputtering target according to claim 4, wherein a total content of impurities excluding gas components, Ru, Si and said one or more alloying elements is 50 wtppm or less.

6. The ruthenium alloy sputtering target according to claim 4, wherein a total content of impurities excluding gas components, Ru, Si and said one or more alloying elements is 10 wtppm or less.

* * * * *